(12) United States Patent
Wang et al.

(10) Patent No.: US 6,331,678 B1
(45) Date of Patent: Dec. 18, 2001

(54) REDUCTION OF BLISTERING AND DELAMINATION OF HIGH-TEMPERATURE DEVICES WITH METAL FILM

(75) Inventors: Tak Kui Wang, Havertown, PA (US); Phillip W. Barth, Portola Valley; Michel G. Goedert, Mt. View, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/429,051

(22) Filed: Oct. 29, 1999

(51) Int. Cl.[7] .............................. H05K 1/00; H05K 1/03; H05K 1/09
(52) U.S. Cl. .................... 174/253; 174/255; 174/256; 361/750; 361/751; 428/209; 428/901
(58) Field of Search .................... 174/253, 255, 174/256, 259, 261, 262, 264, 257, 260; 361/792, 750, 751, 780, 794, 748, 803, 793, 795, 320, 760; 428/209, 210, 214, 344, 901, 458

(56) References Cited

U.S. PATENT DOCUMENTS

| | | |
|---|---|---|
| 3,781,596 * | 12/1973 | Galli et al. .......................... 361/751 |
| 3,986,897 | 10/1976 | McMillan et al. .................. 148/627 |
| 4,012,756 | 3/1977 | Chaudhari et al. .................... 357/5 |
| 4,164,607 * | 8/1979 | Thiel et al. ........................... 428/621 |
| 4,501,144 | 2/1985 | Higashi et al. ....................... 73/204 |
| 4,525,733 | 6/1985 | Losee .................................... 357/65 |
| 4,683,159 | 7/1987 | Bohrer et al. ........................ 428/138 |
| 4,696,188 | 9/1987 | Higashi .................................. 73/204 |
| 4,716,071 * | 12/1987 | Roberts et al. ....................... 428/209 |
| 4,891,977 | 1/1990 | Johnson et al. .................... 73/204.26 |
| 4,952,904 | 8/1990 | Johnson et al. ......................... 338/36 |
| 4,963,701 * | 10/1990 | Yasumoto et al. .................... 174/256 |
| 5,998,000 * | 12/1999 | Ikeda et al. ........................... 428/210 |
| 6,184,477 * | 2/2001 | Tanahashi ............................. 174/261 |
| 6,184,478 * | 2/2001 | Imano et al. .......................... 174/261 |

* cited by examiner

Primary Examiner—Jeffrey Gaffin
Assistant Examiner—I B Patel

(57) ABSTRACT

A device with a multi-layered micro-component electrical connector. The multi-layer micro-component electrical connector includes a dielectric layer, a micro-mesh of a first electrical conductor secured to the dielectric layer, and a second electrical conductor secured to and contacting the micro-mesh to provide electrical communication. The dielectric layer has a dielectric layer thermal expansion coefficient and the first electrical conductor has a thermal expansion coefficient different from the dielectric layer thermal expansion coefficient. Due to the presence of the micro-mesh the device is operable at temperatures above 250° C. without delamination or blistering of the first electrical conductor from the dielectric layer.

12 Claims, 8 Drawing Sheets

REDUCTION OF BLISTERING AND DELAMINATION OF HIGH-TEMPERATURE DEVICES WITH METAL FILM

FIELD OF THE INVENTION

The present invention is related to techniques for forming high temperature devices that have films of dissimilar thermal expansion coefficients adhered together, more specifically, for forming sensor devices which are used in high-temperature operation and which are formed by a method in which metal films are processed under high temperature.

BACKGROUND

The use of metal thin films and filaments is very common in measurement and sensing devices, such as flow and velocity sensors. In such measuring and sensing devices, often a hot conductor thin filament that can dissipate heat is held in a fluid stream. When the conductor filament loses heat to the fluid stream, its temperature falls. The resulting change in electrical resistance of the conductor filament associated with the fall in temperature can be measured and it would be indicative of the flow characteristics of the fluid stream. Often such conductor filaments are made from conductor thin films. For making the conductor filament (or thin film), a variety of metals can be used. For such measurement and sensing applications, platinum is preferred over other metallic substances because of its refractory nature as well as its high electrical resistance and temperature coefficient of resistance (TCR). It is also inert and can operate at a high temperature.

In some applications, because of the catalytic nature of platinum, to prevent unwanted chemical reaction, it is desirable to completely encapsulate the platinum in a thin dielectric film such as silicon nitride or silicon oxynitride. The dielectric also serves as a support material for the thin film platinum. However, because of the inert nature of platinum, it does not adhere well to most dielectric materials. Furthermore, the platinum thin film is made by deposition on a surface and during the subsequent fabrication of the measurement or sensing device, it may be necessary to anneal the deposited thin film at a high temperature. Annealing improves the material properties of thin film platinum. It typically reduces the resistance and increases the thermal coefficient of resistance of the thin film to close to the bulk value. The annealing typically takes place at temperatures at or above 800° C. At this high temperature, due to thermal expansion mismatch of the thin metal film with the substrate (i.e., the material supporting the thin metal film), high stress results in the film and at the interface. The stress can be so high as to cause the metal to totally come off (delaminate) or blister from the substrate. If a platinum thin film is used to form one of the layers of electrical contact pads, the poor adhesion of the platinum on the underlying dielectric material causes a weak link that can result in bond pad failure. On a metal film attached to a dielectric material having a different coefficient of expansion from that of the metal film, blistering and protrusions (hillocks) can form when the metal film experiences high temperature fluctuation. What is needed a technique for forming a secure adhesion of the conductor metal (especially platinum) on the dielectric material, and methods to reduce the interfacial stress of the conductor metal on the dielectric material so that delamination and blistering are prevented or greatly reduced.

Various groups have conducted investigation on improvement of adhesion of platinum to silicon nitride layers and reduction of stress by texturing the surface before platinum deposition. Documents of interest related to metal film adhesion to dielectric material in sensors include U.S. Pat. No. 4,501,144 (Higashi et al.), U.S. Pat. No. 4,683,159 (Bohrer et al.), U.S. Pat. No. 4,696,188 (Higashi), U.S. Pat. No. 4,891,977 (Johnson et al.), and U.S. Pat. No. 4,952,904 (Johnson et al.). Documents of interest related to hillock formation include U.S. Pat. No. 3,986,897 (McMillan et al.) and U.S. Pat. No. 4,012,756 (Chaudhari et al.).

SUMMARY

In the present invention, a micro-mesh structure is used to reduce the interfacial stress and improve the adhesion of a conductor metal to a dielectric material. In one aspect, a device having such a micro-mesh structure is provided and the method for making it is provided in the present invention. In an embodiment, such a device includes a component (for example, a bond pad, i.e., conductor pad) having a micro-mesh of conductor metal (sometimes referred to as "micro-mesh conductor metal" herein) contacting another conductor metal (which may be a metal different from the micro-mesh conductor metal, such as the conductor metal of a bond pad) to provide electrical communication to the micro-mesh. The second conductor metal, preferably without a micro-mesh structure of its own, adheres to the micro-mesh and the dielectric layer through the openings in the micro-mesh.

In a preferred mode, the present invention provides improved adhesion between the conductor metal and the dielectric material by using an adhesive layer sandwiched between the dielectric material and the micro-mesh conductor metal. This is especially useful in adhering platinum to a dielectric material such as silicon nitride. Further, in an embodiment, the micro-mesh conductor metal is sandwiched between two adhesive layers. Lines (or branches) in the micro-mesh have a cross-section in which the top adhesive layer (which will face a bond pad metal) has a smaller width than that of the micro-mesh conductor metal. In turn, the micro-mesh conductor metal has a smaller width than that of the bottom adhesive layer, which is nearest a supporting substrate. In this way, the bond pad (conductor pad) metal can has contact with the adhesive material and the micro-mesh conductor metal to maintain mechanical integrity and electrical communication.

The incorporation of the micro-mesh (for example, checkerboard) design gives good adhesion of the conductor metal (of the micro-mesh) to the dielectric material. Because the conductor metal and the dielectric material have thermal expansion coefficients that are quite different, temperature changes tend to put stress to delaminate the conductor metal from the dielectric material. Due to the good adhesion provided by the micro-mesh, the risk of delamination is reduced in the device under repeated cycles of high temperature operation. In preferred embodiments, a device according to the present invention is operable at a temperature of at least 250° C. or higher without the first electrical conductor delaminating or blistering from the dielectric layer. Further, this technique of utilizing a micro-mesh reduces the risk of delamination of platinum on silicon nitride when platinum on dielectric (such as silicon nitride) is annealed at high temperature, for example, as in forming and annealing a layer of silicon nitride to encapsulate the platinum. The micro-mesh design also enables devices utilizing a noble metal thin film electrical conductor layer to operate at high temperature in repeated cycles without delamination. The application of the micro-mesh of the present invention is particularly advantageous in integrated circuits using a flip-chip technique. In such circuits, after two components are flip-chip-bonded together, stress on one component will be transmitted to the bond pads of the other component, thus causing delamination of the bond pad conductor metal from the conductor underneath it if the adhesion force between them is not strong enough.

BRIEF DESCRIPTION OF THE DRAWINGS

The following figures are included to better illustrate the embodiments of the apparatus and technique of the present invention. In these figures, like numerals represent like features in the several views. For clarity of illustration, unless specified to be otherwise in context, features in the figures are not drawn to scale.

DETAILED DESCRIPTION OF THE INVENTION

By incorporating a micro-mesh structure of a metallic substance that is attached to a dielectric layer, the metallic substance can be secured to the dielectric layer without blistering or delamination. Further, bond pads (conductor pads) of the present invention can operate under high temperature and not result in the conductor metal (e.g. platinum) delaminating from the dielectric material supporting it. It is to be understood that the micro-mesh structure of the present invention can be used to make sensors (including flow sensors, chemical sensors, thermal conductivity detectors), heaters, semiconductor devices, and bonding pads, such as those described in U.S. Pat. No. 4,501,144 (Higashi et al.), U.S. Pat. No. 4,683,159 (Bohrer et al.), U.S. Pat. No. 4,696,188 (Higashi), U.S. Pat. No. 4,891,977 (Johnson et al.), and U.S. Pat. No. 4,952,904 (Johnson et al.), which are incorporated by reference in their entireties herein.

Figure 1:
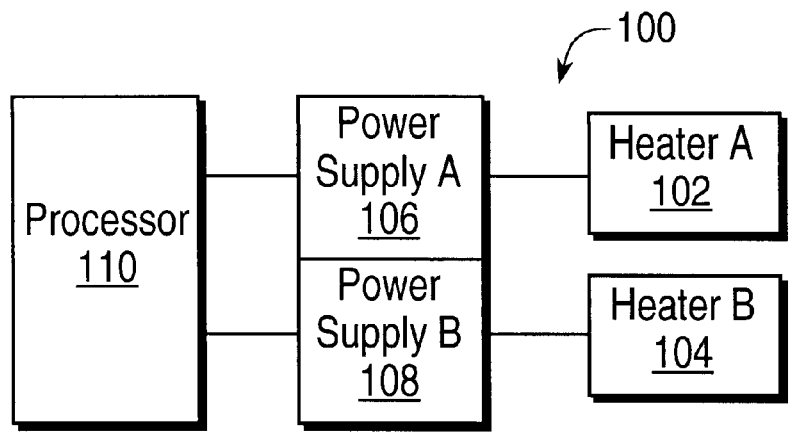
FIG. 1 is a schematic representation showing an embodiment of a sensor device of the present invention.

As an illustration of the present invention, a sensor (e.g., a flow sensor) containing multiple-layered microstructures is described herein. It is to be understood that the present techniques and structures for attaching layers of different material can be applied to other devices that are not flow sensors. FIG. 1 shows, for illustrative purpose, the embodiment of a sensor 100 including heater A 102 and heater B 104, which are electrically connected to power supply A 106 and power supply B 108, respectively. In turn, power supply A 106 and power supply B 108 are electrically connected to a processor 110, which can determine the energy, voltage, current, and the like, supplied by the power supplies 106, 108 to the heater 102, 104. The processor can include, for example, a microprocessor, computer (such as a personal computer, minicomputer, mainframe computer, etc.), and the like. It is to be understood that the power supplies 106, 108 and the processor 110 can be integrated as a single unit so that the energy output of heaters can be measured by the unit. As used herein, unless specified otherwise in context, the terms "conduct," "conductor," and "conductive" refer to electrical conduction.

Figure 2:
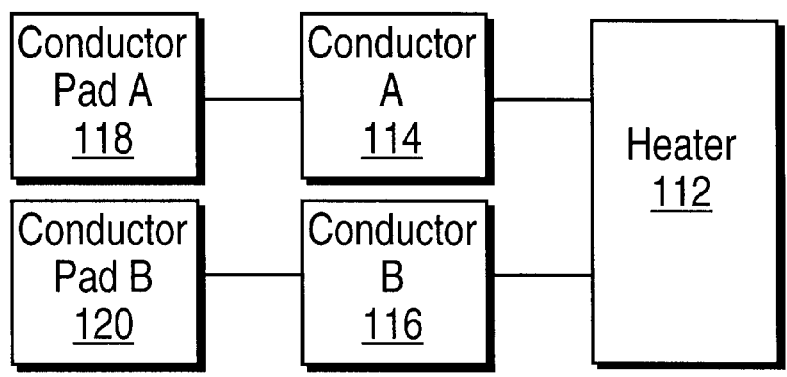
FIG. 2 is a schematic representation showing a heater connection in an embodiment of a sensor device of the present invention

In further detail, FIG. 2 illustrates an embodiment of how a heater in the flow sensor of FIG. 1 can be electrically connected to a power supply. A heater 112 (e.g., heater 102 or heater 104 of FIG. 1), for example, a resistor, is electrically connected at its two electrical terminals via conductor A 114 and conductor B 116 to electrical bond pad (conductor pad) A 118 and electrical bond pad B 120 respectively. Connection by external electronics (e.g., for power supply or signal transmission) to the bond pad can be via wire bonding, flip chip bonding, soldering, and the like.

Figure 3:
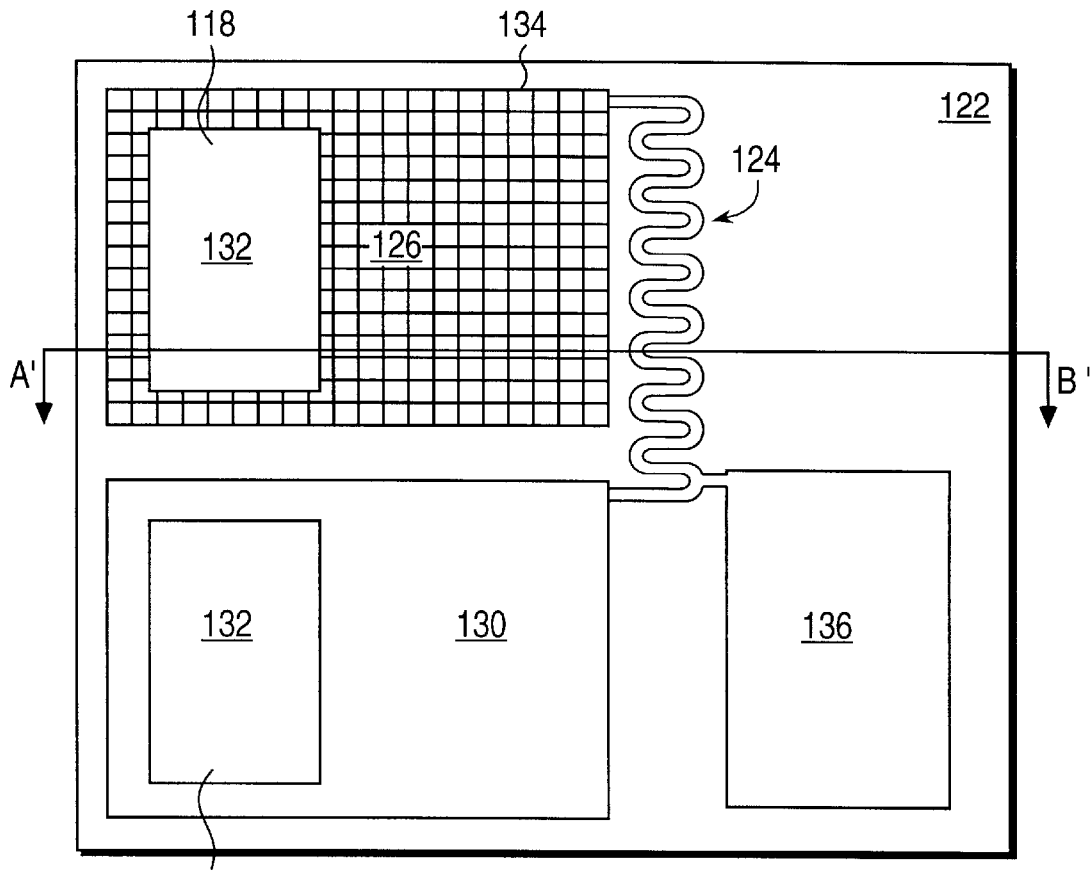
FIG. 3 is a schematic representation showing a heater connection to bonding pads in the embodiment of FIG. 2.

FIG. 3 shows a schematic representation of the circuitry 122 in portion of the sensor having heat sensor 112 and conductor A 114, conductor B 116, and their respective bond pads 118, 120 shown in FIG. 2. Heater 112 includes a resistor 124 (in FIG. 3) electrically connected to bond pad A 118 and bond pad B 120 via conductor micro-mesh A 126 and conductor micro-mesh B 130, respectively. The resistor 124 has a serpentine shape. The line width of the resistor 124 is about 10 microns, although other widths can be used and will be apparent to one skill in the art based on the present disclosure. Bond pad A 118 and bond pad B 120 each include a layer of gold 132 laid on top of an adhesion film of a material such as titanium-tungsten (Ti—W). The Ti—W film is typically about 200 Å to 500 Å thick. Those skilled in the art will know that Ti—W is a standard adhesion promoting material for attaching thin film gold onto materials such as silicon nitride, oxides or silicon oxynitrides, as well as to platinum. The Ti—W film is in turn laid on top of part of the electrically conductive micro-mesh (i.e., conductor micro-mesh 126 or 130), as in the area of a bond pad. As used herein, when a "conductor metal layer" is laid on a nonconductive adhesive layer (such as an oxide, e.g., $TiO_2$) or to a dielectric material such as silicon nitride, it is contemplated that the conductor metal layer that contains gold may include a Ti—W adhesion promoting metal film between the gold and the nonconductive adhesive layer or between the gold and the dielectric material.

In the embodiment shown in FIG. 3, the conductive micro-mesh 126 and 130 are constructed in a grid pattern 134. The resistor 124 is also electrically connected to other electronic components and circuits 136 for operating, controlling and collecting information from the resistor 124. Using a micro-mesh instead of a continuous strip of conductor to connect the resistor 124 to a bond pad enables the conductor A 114 and conductor B 116 to accommodate more stress, thus to maintain on an underlying dielectric material without delaminating. Comparing to a solid strip of conductor of similar electrical resistance, the micro-mesh has substantially smaller line width in the conductor lines (branches, e.g., 10 microns). The micro-mesh reduces the compressive stress that can build up in the thin platinum film during the annealing process and later in the high temperature operating condition. As used herein, the term "micromesh" refers to a structure that has interconnecting branches (or lines) such that electricity can travel from one end of the micro-mesh to the other end through the branches (or lines). A micro-mesh has a line or branch width in the micron range, i.e., smaller than 1 mm. Examples of micro-mesh patterns are shown in FIGS. 15A–15C and FIGS. 16A–16B. Since the branches (or lines) may or may not overlap, there are void areas between some of the branches or lines through which other materials can pass through in the construction of a multiple layers component. With the multiple interconnecting branches in the micro-mesh, the resistance in the micromesh can be kept low. Thus, in FIG. 2, the resistance from the conductor A 114 and conductor B 116 to the bond pad A118 and conductor B120 can be kept low. It is to be understood that the term "interconnect" as used herein refers to two or more lines or branches connecting together to form portions of the micro-mesh and it is not necessary that all the lines (or branches) connect together at the same point. It is also to be understood that a variety of line (or branch) widths can be used for the interconnecting branches in the micro-mesh conductor micro-mesh A 126 and conductor micro-mesh B 130. Typically, for ease of construction and adhesion of the platinum to the dielectric layer, a line width of about 2 microns to 200 microns can be used. The line width is preferably less than 100 microns, more preferably about 5 microns to 50 microns, and even more preferably about 5 microns to 20 microns. The separation (gap) between neighboring lines (or branches) of the micro-mesh is about 0.2 micron to 200 microns, preferably about 2 microns to 20 microns. It is to be understood that the line width for the resistor 124 can also vary for similar design reasons as those of the conductor micro-mesh A 126 and conductor micro-mesh B 130, as well as for allowing optimal fluid flow and access around the resistors.

FIG. 4 to FIG. 13 show sectional views of an embodiment illustrating the construction of a portion of a heater with connections for electrical contacts. The sectional views of FIG. 4 to FIG. 13 generally correspond to a section along line A'B' of FIG. 3 to show the cross-section of lines (or branches) of the micro-mesh, although for the sake of clarity in drawing, not all features of FIG. 13 have a corresponding feature in FIG. 3. It is also noted that the figures are not to scale for the sake of clarity in showing specific features.

Figure 4:
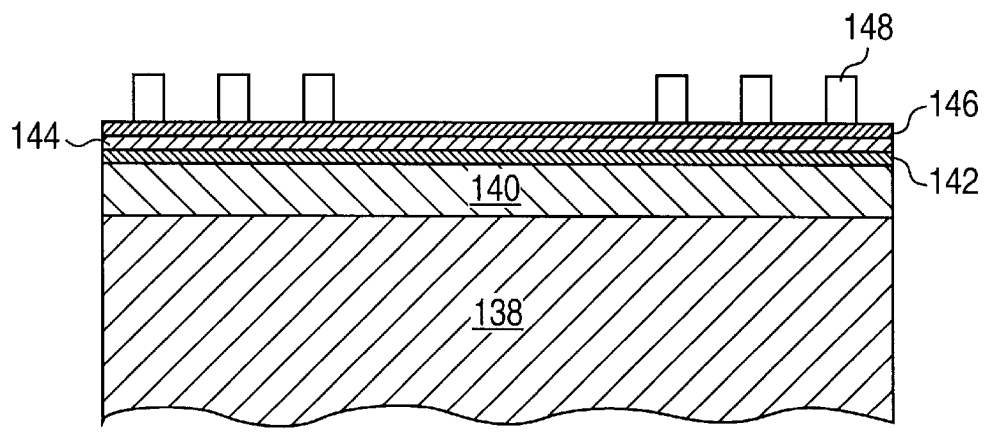
FIG. 4 to FIG. 13 are sectional views in portion showing the different stages of how a heater and bonding pad similar to those in FIG. 3 are made.

FIG. 4 shows in sectional view in portion of a silicon substrate 138 having a first silicon nitride layer 140, first adhesive layer 142, a platinum film 144 to provide electrical conductivity, and a second adhesive layer 146. The inclusion of the adhesive layers 142 and 146 improves the adhesion of the platinum film 144 to a dielectric material (e.g., silicon nitride layer 140. The subsequent structuring of the platinum film 144 into a micro-mesh (e.g. checkerboard pattern) further facilitates the maintenance of adhesion at high temperatures, e.g., at or above about 200° C., more particularly at or above about 300° C. A patterned photoresist layer 148 lies on top of the second adhesive layer. Techniques for making the structure of FIG. 4 are known in the art. For example, a dielectric layer such as the first silicon nitride layer 140 (e.g., a 0.5 micron thick layer of LPCVD silicon nitride is laid on top of the substrate 138. LPCVD (Low Pressure Chemical Vapor Deposition) is a well known process in which a gas mixture is passed into a chamber containing the substrate on which a material is being deposited. The chamber is maintained at low pressure and high temperature. The gas molecule will break down and recombine to form the material desired. To form silicon nitride, a typical gas mixture would be ammonia ($NH_3$) and silane ($SiH_4$). Typically silane is diluted with nitrogen for safety reasons. The chamber is heated to 850° C. $NH_3$ and $SiH_4$ will react to form silicon nitride, $Si_3 N_4$, with hydrogen purged. Alternately chlorosilane ($SiH_2Cl_2$) can be used instead to form $Si_3 N_4$.

An adhesive layer 142 is formed subsequently. For example, a 300 Å layer of $TiO_2$ is sputtered on the dielectric layer 140 and annealed in an oxygen atmosphere at 700° C. for 3 hours. The annealing ensures that the adhesive layer 142 is adequately oxidized to $TiO_2$. A metallic conductor layer is formed, e.g., by evaporating platinum and depositing a 1000 Å film on the adhesive layer of $TiO_2$. The platinum film can alternatively be formed by sputtering. Preferably, the platinum film is formed on the dielectric layer with a slight tension. This can be achieved by heating the material receiving the platinum to a moderate temperature, e.g., about 300° C. to 400° C. Similarly, the stress in a sputtered platinum film can also be controlled by changing the pressure in the sputtering chamber. A small tension will cause less of compression on the dielectric layer for any subsequent treatment at high temperature (e.g., at 850° C.). Another adhesive layer 146 of $TiO_2$ is sputtered on the metal layer (e.g., platinum film). The photoresist is patterned on the second adhesive layer 146 by standard techniques for depositing the photoresist, irradiating a pattern on the photoresist, developing it, and removing the undeveloped material.

Figure 5:
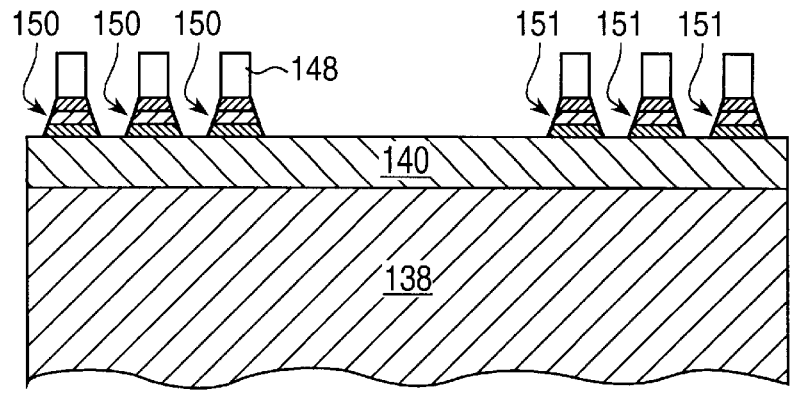

FIG. 5 shows the structure of FIG. 4 after etching by ion milling to remove part of the $TiO_2$—platinum—$TiO_2$ layers, i.e., the part that is not substantially shielded by the patterned photoresist 148. The etching stops at the $TiO_2$—silicon nitride interface. The $TiO_2$—platinum—$TiO_2$ layers remaining has a trapezoidal sectional view. For the sake of easy reference and recognition in the figures showing sectional views, the term "trapezoid" is used herein to refer to the lines (branches) having a trapezoidal cross-section, although the lines (branches) in the mesh also has an elongated dimension. Preferably, the $TiO_2$—platinum—$TiO_2$ trapezoids 150, 151 had an angle of about 45° plus or minus about 5° between the slope side of the trapezoids 150, 151 and the base thereof. As an example for illustration, the etching is patterned to form lines (or branches) of the micro-mesh about 10 microns wide and having gaps of about 15 microns between neighboring lines (or branches).

Figure 6:
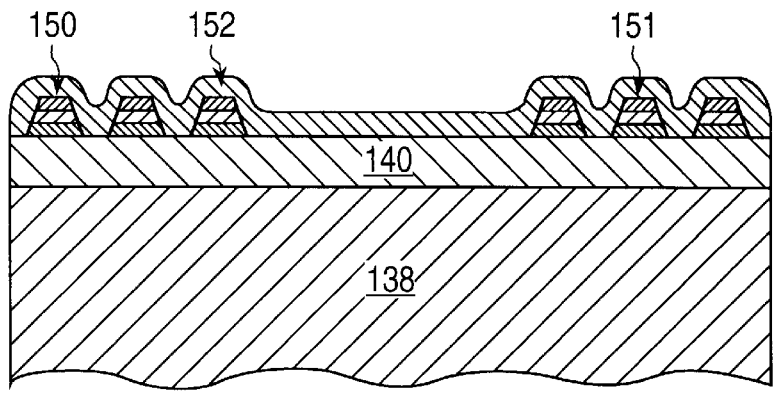
Figure 7:
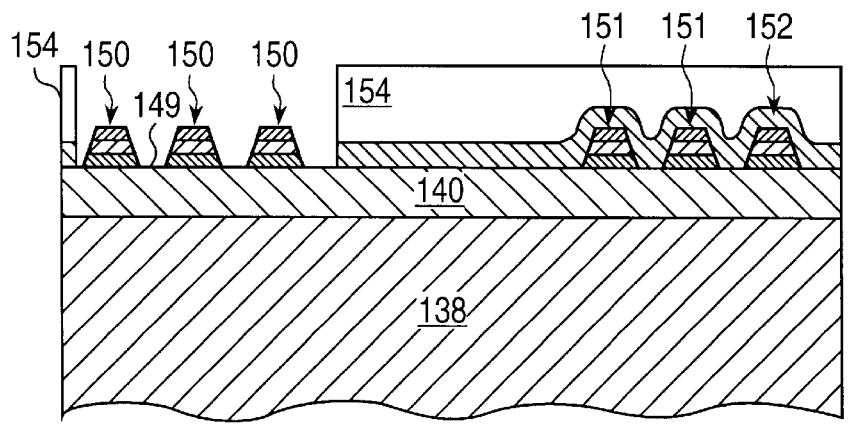

Subsequently the photoresist 148 is removed and a second layer of dielectric material, such as a 0.5 micron thick layer of LPCVD silicon nitride 152 is layered on the structure, forming the structure of FIG. 6. The resulting structure is then annealed at 850° C. for 24 hours. Then, as shown in FIG. 7, part of the second dielectric (i.e., the silicon nitride layer 152) is etched away to expose the adhesive layers and the metal layer of the trapezoids 150, which are to be used for forming the bond pads, such as bond pad A 118, bond pad B 120. The part of the silicon nitride layer 152 over trapezoids 151 for covering the resistor (e.g., resistor 124 of FIG. 3) is not removed. This can be accomplished by having a patterned photoresist 154 to protect areas in which the removal of the second dielectric layer 152 is not desired.

Figure 8:
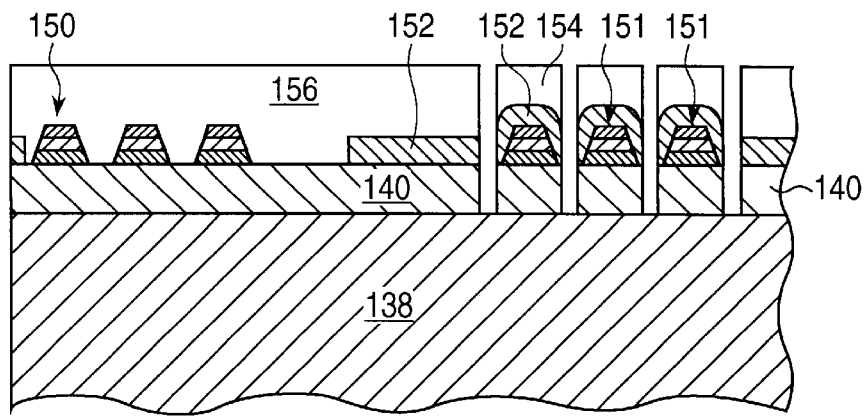

Subsequently, photoresist layer 156 is formed on the trapezoids 150 to protect them and the photoresist 154, as well as dielectric material 140, 152 about the trapezoids 151 are dry-etched, resulting in a structure shown in FIG. 8. The dry etch can be done with various techniques, including ion milling, plasma etch, reactive ion etch, and the like. Then, the photoresist material 154, 156 is removed and a thin layer of titanium-tungsten (Ti—W) 160 (about 200 Å to 500 Å thick) is deposited on the resulting structure, shown in FIG. 9. Ti—W adhesion promotion materials (or "adhesive materials") for bonding gold, platinum, etc., are known in the art. Further, one skilled in the art will know the variation of the ratio of titanium to tungsten to use.

Figure 9:
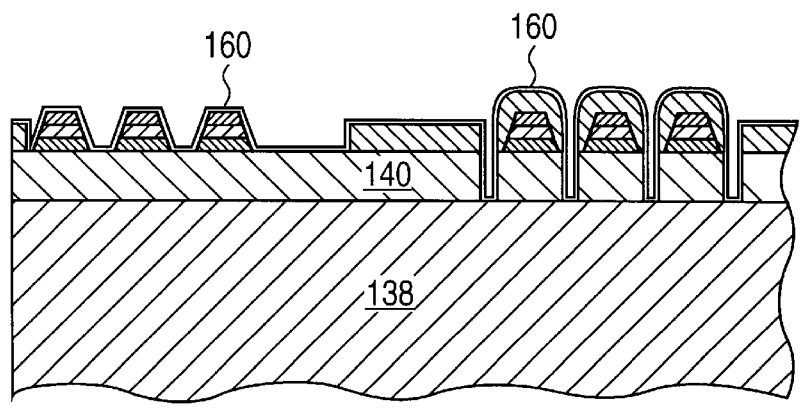
Figure 10:
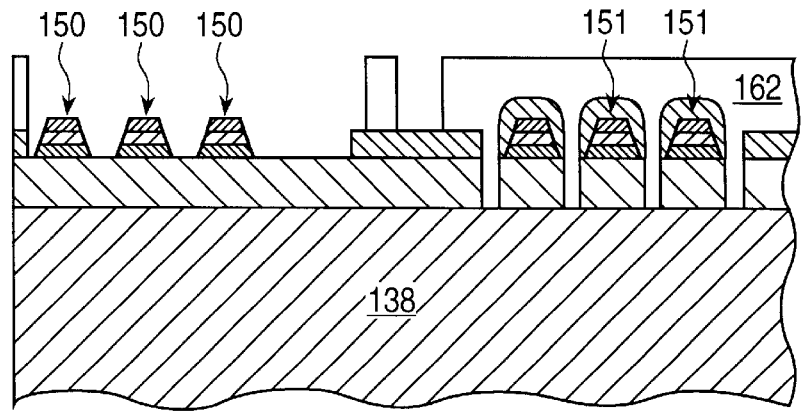
Figure 11:
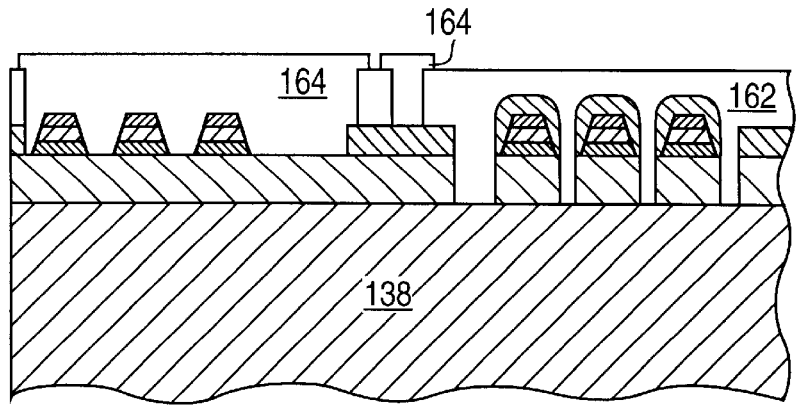
Figure 12:
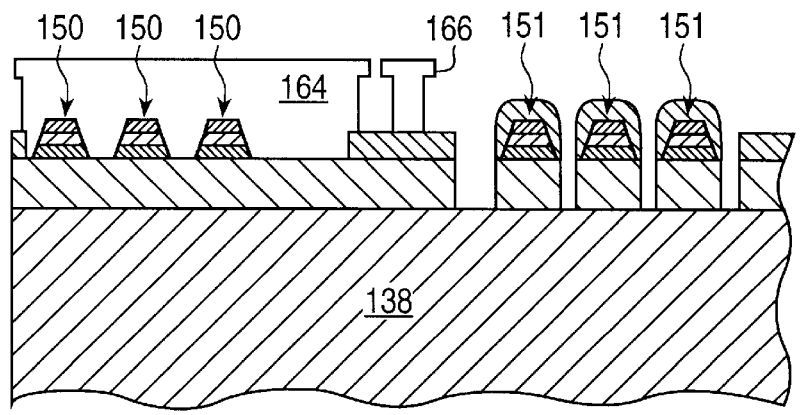
Figure 13:
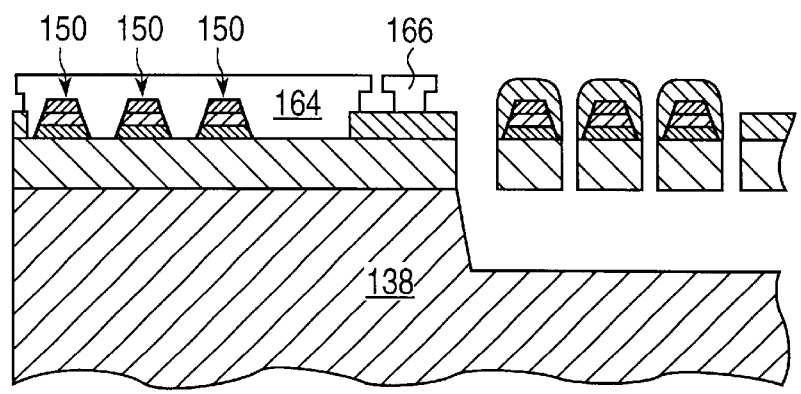

Subsequently, a patterned photoresist layer 162 is formed on the structure of FIG. 9 to protect the area on which a conductor layer is not desired (e.g., a gold layer for providing electrical conduction), resulting in a structure shown in FIG. 10. FIG. 11 shows that subsequently gold 164 is deposited, e.g., by electroplating on the structure of FIG. 10. The gold layer 164, formed to be used for bonding to an external electronic component as a bond pad, will be substantially thicker than the titanium-tungsten. After the removal of the photoresist 162, the structure of FIG. 12 remains, having trapezoids 150 being in contact with a layer of gold 164, forming a bond pad, such as bond pad A 118 and bond pad B 120, as shown in FIG. 12. By chemical etching, a part of the silicon substrate 138 under the trapezoids 151 of the resistor is removed to allow the serpentine resistor to be exposed to fluid flow all around each resistor line (or branch) 168, all of which have trapezoidal cross-section. Further, for illustration purposes, another gold strip 166 also remains after the chemical etching. Such a gold strip (and other ones) can be made for purposes of connection and isolation. Such a gold strip when made by adhering via a Ti—W adhesive layer on a metal oxide (e.g., TiO$_2$) adhesive layer is isolated from the underlying first conductor (e.g., platinum micro-mesh) by the metal oxide in areas in which the micro-mesh and the gold strip overlap. The resulting structure is shown in FIG. 13.

The bonding from the platinum film 144 to the contact metal, e.g., gold layer 164, provides electrical conduction. The adhesive strength between them, however, is relatively weak. With a micro-mesh structure according to the present invention, the contact metal (e.g., gold layer 164) adheres strongly to the underlying dielectric layer, e.g., silicon nitride layer 140 via the adhesive layers 142, 146. Because of the ability of a micro-mesh to reduce stress, the risk of delamination due to the inflexibility of a continuous sheet of platinum is substantially reduced. Thus, the requirement of forming both a low resistance contact and strong mechanical structure in the contact area is achieved. The dielectric (e.g., silicon nitride) layer is secured to the micro-mesh. Typically, the dielectric material and the micro-mesh conductor metal have different coefficients of thermal expansion. Because of its ability to reduce stress, the micro-mesh structure allows the micro-mesh conductor metal to be secured to the dielectric material, as well as to the bond pad, without separating even after undergoing cycles of temperature change.

It is noted in the void area 149 of the micro-mesh structure, i.e., the area between the lines (wires or branches) of the micro-mesh, as well as in the other area of the bond pad outside the micro-mesh, the conductor metal that is laid on the micro-mesh area reaches into the void area 149 and attaches to the dielectric material (e.g., nitride layer) via the Ti—W adhesion promotion layer 160.

Figure 14A:
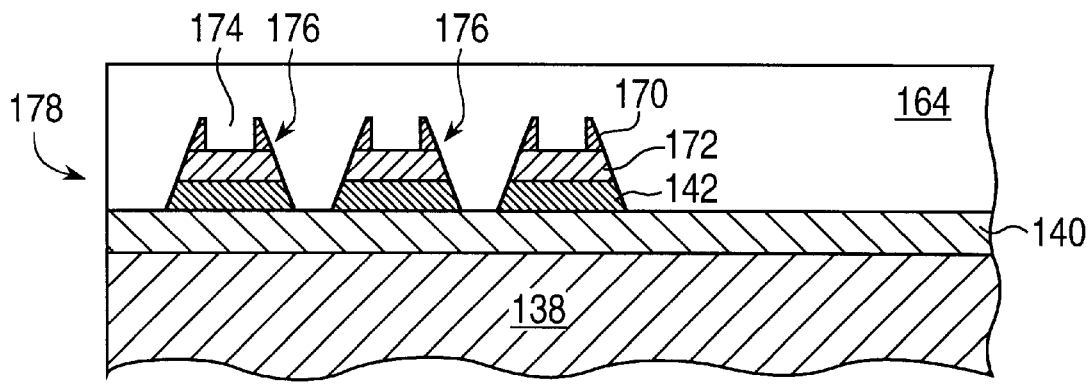
FIG. 14A is a sectional view showing an embodiment of how the bond pad conductor metal is secured to the micro-mesh conductor metal.

FIG. 14A shows an alternative embodiment for attaching a conductor metal to a micro-mesh to form a bond pad. In FIG. 14A, "volcano" section-shaped structures 176 are used for adhering conductively to the contact metal (e.g., gold 164) in a bond pad 118. In the volcano section-shaped structures, the second adhesive layer 170, which is laid on top of the micro-mesh metal (platinum film) 172 has a well 174 opening to the top of the volcano section-shaped structures 176. It is to be understood that the "volcano section-shape", similar to the use of the term "trapezoid" herein, indicates only the cross-sectional shape and not the overall three-dimensional shape of the line (or branches) of the mesh. The well 174 extends to the conductor metal (platinum film) to provide electrical connection from the conductor metal (e.g. gold) 164, such as the conductor metal in bond pads. The walls 180 of the well 174 provide adhesive surface for binding to the conductor metal (e.g., gold 164).

Figure 14B:
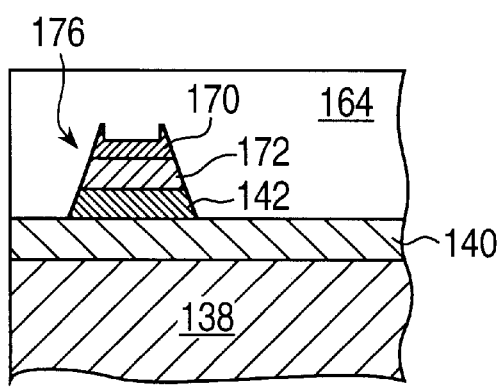
FIG. 14B is a sectional view showing another embodiment of how the bond pad conductor metal is secured to the micro-mesh conductor metal.
Figure 15A:
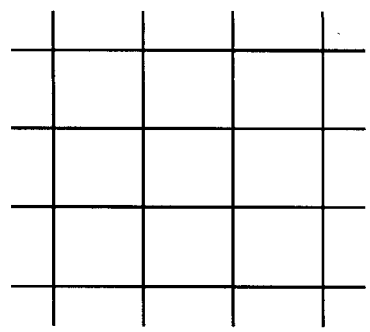
FIG. 15A to FIG. 15C are schematic representations of embodiments of grid configuration of the micro-mesh of the present invention.
Figure 15B:
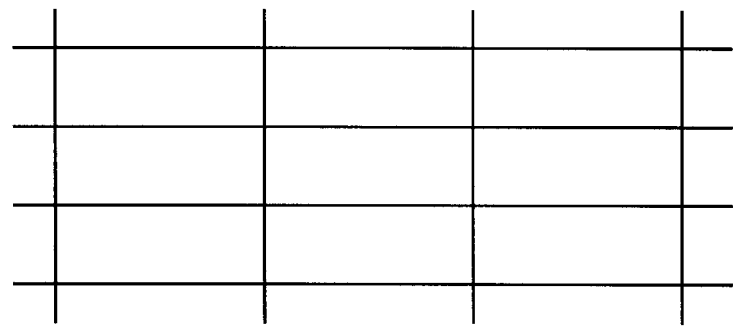
Figure 15C:
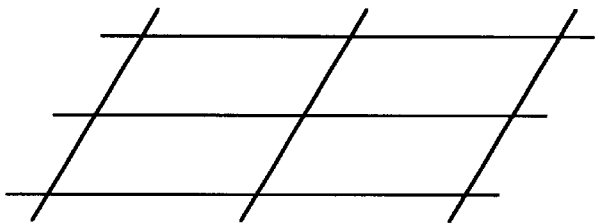
Figure 16A:
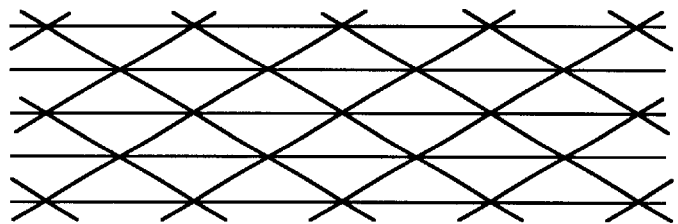
FIG. 16A and FIG. 16B are schematic representations of certain other embodiments of grid configuration of the micro-mesh of the present invention.
Figure 16B:
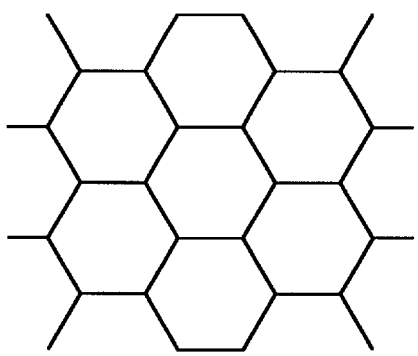

FIG. 14B shows yet another variation of a micro-mesh in the present invention. By controlling the etching of the side walls of the volcano section-shaped structures 176, the conductor metal (e.g., gold) 164 can make electrical contact with the platinum 172 on the side walls of the volcano-shaped structures 176. The top adhesive layer 170 do not need to be extensively removed by etching, or the well does not need to reach to the platinum. This allows for more freedom in the use of the adhesive layer.

The micro-mesh of the present invention for providing stable attachment and electrical connection to conductor metal to result in bond pads (conductor pads), conductor passages, and the like, can have a variety of patterns. For example, the micro-mesh can have a grid pattern as that shown in conductor micro-mesh A of FIG. 3. As shown in FIGS. 15A–16B, the grid can have a variety of patterns: square (FIG. 15A), rectangle (FIG. 15B), or parallelogram (FIG. 15C), such as a rhombus. Other applicable patterns include, but are not limited to, triangle (FIG. 16A), hexagon (FIG. 16B), combination of various patterns, and even a relatively irregular pattern.

It is noted that the micro-mesh of the present invention is useful not only for forming a bond pad, but also for forming a conductor passage, for example one leading from the heater (resistor) to the bond pad, such as conductor A 114 and conductor B 116. One skilled in the art will understand that high resistance in a conductor passage is not desirable since it may distort the signal and power being transferred. For example, the electrical resistance a conductor passage should be 1% or less, preferably 0.1% or less, of the resistance of the resistor. To decrease the resistance, the width of conductor passage would need to be adequately wide, which, if the conductor is made of a metallic substance that does not adhere well to the dielectric material, might lead to delamination of the conductor passage from the dielectric material. Thus, the micro-mesh of the present invention will be useful. The technique of construction of the conductor passage will be similar to the technique for making the bond pad. However, in the construction of such a conductor passage, the top gold layer and the Ti—W adhesion promotion layer are not needed. Instead, the metallic micro-mesh can be covered by nonconductors (e.g., the second adhesive layer 146 and a nitride layer thereon). It is further understood that it is not necessary to make the heater, the conductor passage, and the bond pad with the same metal. For example, it is contemplated that the heater (resistor) can be made with platinum and the micro-meshes at the bond pad and at the conductor passage can be made from copper, gold, aluminum, and the like, or any metallic electrically conductive material. Further, the resistor can be made with other metallic materials as well.

It is noted that the techniques of the present invention will provide a conductor metal that adheres well to a dielectric layer such that blister formation is substantially reduced or eliminated. For example, in the construction of thermal conductivity detectors, e.g., for chemical analysis using channels such as chromatography and electrophoresis, platinum is used as a filament. However, while encapsulating the platinum filament in a dielectric, such as PECVD silicon nitride, hydrogen is present and may dissolve in the dielectric. PECVD is Plasma Enhanced Chemical Vapor Deposition. To form a silicon nitride layer, enough energy must be provided to the molecules to break them down so they can recombine to form the desired molecule. In PECVD, energy is provided by the plasma (whereas in LPCVD, the energy comes in the form of thermal energy). While the gas has high temperature, the substrate can be at a much lower temperature. Typical deposition temperature for PECVD nitride or silicon oxynitride is about 400° C. Such a detector device can undergo repeated cycling of the platinum filament between high and low temperatures in episodes of high temperature operation and still retain its integrity.

Comparative Examples

On a single chip, platinum micro-mesh with wires (i.e., lines or branches) of 10 microns width with 15 microns space between the wires was made on a silicon nitride layer on a substrate by means of a $TiO_2$ adhesive layer. On the same chip was an area of platinum about 30 microns by 30 microns with no holes in it (i.e., it is not a mesh structure). Upon annealing to 750° C. for two hours, some blistering was observed in the 30 microns by 30 microns area indicating the separation of the platinum film from the silicon nitride underneath it. No blister was seen in the micro-mesh area.

Figure 17:
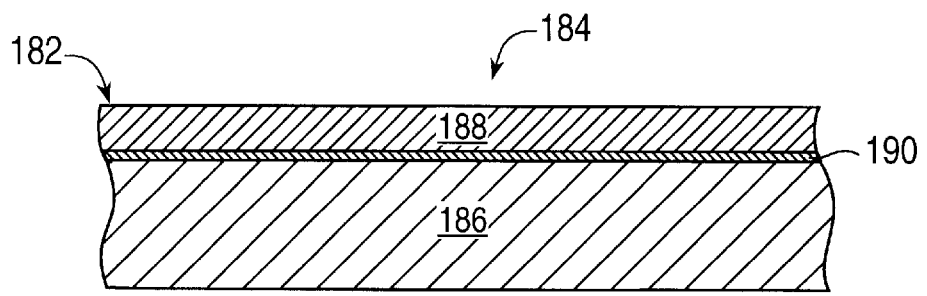
FIG. 17 shows a conductor portion of a flexible circuit having a metallic micro-mesh attached to a polymeric dielectric material layer.

In other embodiments, the electrically conductive micro-mesh can be formed on a polymeric dielectric material to provide a bond that is resistant to delamination. Further, the dielectric material can itself be the supporting substrate. This is true for dielectric materials such as silicon nitride, and is especially true for polymeric materials which can be shaped by micromachining mechanically, by laser ablation, molding, or wet etching. For example, a heat resistant polyimide can be used as the dielectric for making an electrical component that has a metal micro-mesh laid thereon for conducting electricity in a device that can operate up to 300° C. An example of a applicable polyimide is KAPTON or UPILEX from DuPont (Wilmington, Del.). Such an electrical component is illustrated in FIG. 17, which shows a conductor portion 182 in a flexible circuit component 184, which is pliable without the conductor delaminating from the supporting polyimide dielectric 186. To improve the adhesion of the metallic micro-mesh 188 (such as platinum or gold) to the polymer, a metal adhesive material 190, such as titanium, or titanium tungsten, can be used. It is to be understood that structures such as resistors, bond pad, etc. can be made by adhering gold to platinum on a polymeric dielectric material. Further, it is to be understood that a conductor micro-mesh can be attached to a dielectric without a separate adhesive layer. For example, titanium itself can be attached to polyimide or silicon nitride without using a different material as an adhesive. Also, inorganic dielectric materials other than silicon nitride can be used, e.g., aluminum oxide, aluminum nitride, titanium oxide, silicon dioxide, various types of glass, quartz, and the like.

In a thermal conductivity sensor or a chemical sensor, resistors and conductors can be made and used in ways similar to the above-describe embodiments of a flow sensor. For example, in analytical equipment such as a gas chromatography, to analyze a substance that has passed through a column, a thermal conductivity sensor or detector (TCD) is exposed to the substance. With a constant energy output by a heater, depending on the substance's ability to change the temperature profile about the heater in the TCD, the presence of the substance can be determined.

Although the preferred embodiment of the present invention has been described and illustrated in detail, it is to be understood that a person skilled in the art can make modifications within the scope of the invention. For example, it is to be understood that the $TiO_2$ in the above describe embodiment can be replaced with other adhesive materials known in the art, such as titanium, chromium, titanium-tungsten alloy, nickel-chromium alloys, other metal oxides, including nickel oxide ($Ni_2O_3$), chromium oxide ($Cr_2O_3$), aluminum oxide ($Al_2O_3$), tantalum oxide ($Ta_2O_3$), and the like. Furthermore, other than platinum, examples of alternative conductor material including nickel-iron (permalloy), nickel, and gold can also be used. Also, other than silicon nitride, examples of alternative dielectric material that can be used include silicon dioxide and silicon carbide.

What is claimed is:

1. A device, comprising a multi-layered electronic microcomponent that comprises:
   (a) a dielectric layer on a substrate, the dielectric layer having a dielectric layer thermal expansion coefficient; and
   (b) a micro-mesh of a first electrical conductor secured to the dielectric layer, the first electrical conductor having a thermal expansion coefficient different from the dielectric layer thermal expansion coefficient, wherein the device is operable at a temperature of at least 250° C. without the first electrical conductor delaminating or blistering from the dielectric layer.

2. A device according to claim 1 wherein the dielectric layer is made of a dielectric material selected from the group consisting of silicon nitride, silicon oxynitride, silicon carbide aluminum nitride, titanium oxide, silicon dioxide, glass, quartz, and polymer and the first electrical conductor is selected from the group consisting of platinum, nickel, permalloy, and gold.

3. A device according to claim 2 wherein the first electrical conductor is made of one of platinum, nickel, and permalloy.

4. A device according to claim 1 further comprising a second electrical conductor secured to the micro-mesh of the first electrical conductor to provide electrical communication.

5. A device according to claim 4 comprising a first adhesive layer to facilitate securing the micro-mesh to the dielectric layer and using a metal adhesive layer to facilitate securing the second electrical conductor to the micro-mesh and securing the second electrical conductor through voids in the micro-mesh to the dielectric layer, and comprising a substrate contacting the dielectric layer on a side thereof opposite to the micro-mesh.

6. A device according to claim 5 further comprising a second adhesive layer contacting the first electrical conductor, the first and second adhesive layers and the first electrical conductor each have a micro-mesh shape such that they together form a micro-mesh having micro-mesh branches in which the first electrical conductor is sandwiched between the first and second adhesive layers and wherein the second electrical conductor via the metal adhesive layer contacts the first electrical conductor and at least one of the first and second adhesive layers.

7. A device according to claim 5 wherein a layer of the second electrical conductor covers multiple micro-mesh branches and each of said micro-mesh branches has a cross-section in which the second adhesive layer has a smaller width than the first electrical conductor, which in turn has a smaller width than the first adhesive layer, which is nearest the dielectric layer.

8. A device according to claim 1 wherein the micro-mesh branches interconnect to form a two-dimensional repeating pattern.

9. A device according to claim 1, further comprising a resistor being connected via a micro-mesh of the first electrical conductor to a power supply, further comprising a processor to determine one or both of voltage and current variation at the resistor.

10. A device according to claim 1 wherein the micro-mesh of the first electrical conductor has interconnecting micro-mesh branches each having a width of less than 100 microns.

11. A device according to claim 1 comprising electronic circuits connected to the multi-layered component to form a sensor.

12. A supported conductor passage, comprising:

(a) a supporting substrate;

(b) a dielectric layer having a dielectric layer thermal expansion coefficient, supported by the supporting substrate;

(c) attached to the dielectric layer an adhesive layer that can facilitate adhesion of an electrical conductor to the dielectric layer, the electrical conductor having a thermal expansion coefficient different from the dielectric layer thermal expansion coefficient; and (d) a micro-mesh of the electrical conductor secured to the dielectric layer via the adhesive layer wherein electricity can pass from one point to another point through the micro-mesh.

* * * * *